United States Patent [19]
Darmawaskita et al.

[11] Patent Number: 5,854,564
[45] Date of Patent: Dec. 29, 1998

[54] DIRECT SENSOR INTERFACE (DSI) MODULE

[75] Inventors: Hartono Darmawaskita; James B. Nolan, both of Chandler, Ariz.

[73] Assignee: Microchip Technology Incorporated, Chandler, Ariz.

[21] Appl. No.: 855,868

[22] Filed: May 12, 1997

[51] Int. Cl.$^6$ .............................. H03K 5/153; H03K 5/22
[52] U.S. Cl. .................................. 327/78; 327/72
[58] Field of Search ........................... 327/51–54, 56–60, 327/62–68, 72–74, 77–81, 87–90, 142, 198, 345; 323/315–317; 330/51

[56] References Cited

U.S. PATENT DOCUMENTS

| | | | |
|---|---|---|---|
| 5,384,505 | 1/1995 | Takahashi | 327/262 |
| 5,463,333 | 10/1995 | Calder et al. | 327/78 |
| 5,498,986 | 3/1996 | Manlove | 327/77 |

*Primary Examiner*—My-Trang Nu Ton
*Attorney, Agent, or Firm*—Harry M. Weiss; Jeffrey D. Moy; Harry M. Weiss & Associates, P.C.

[57] ABSTRACT

A direct sensor interface (DSI) module which allows a microcontroller to directly interface to sensors having at least one of a resistive, capacitive, and/or current source characteristic. The DSI module is coupled directly to a sensor device, which could be a reference resistor, which generates a sensor current. A current mirroring circuit outputs a charging current proportional to the sensor current. A capacitive sensor and/or a capacitive device is coupled to the current mirroring circuit and generates a voltage when charged by the charging current. Using a comparator and a threshold voltage source, the time it takes the capacitive sensor and/or a capacitive device to ramp up from zero to the threshold voltage can be measured. The charging time is proportional to the sensor reading.

27 Claims, 4 Drawing Sheets

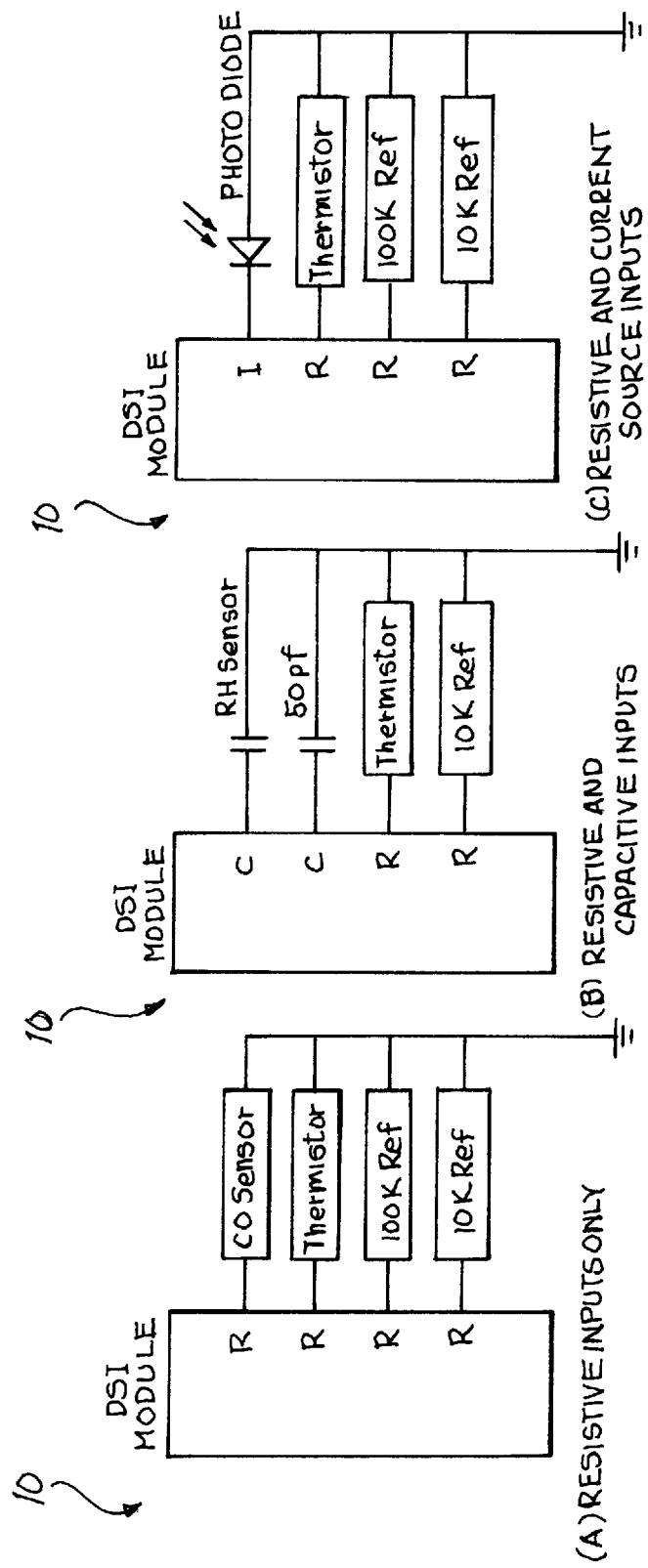

5,854,564

DIRECT SENSOR INTERFACE (DSI) MODULE

BACKGROUND OF THE INVENTION

1. Field of the Invention

This invention relates generally to sensing elements and, more specifically, to a direct sensor interface module which will allow a microcontroller to directly interface with sensors which have resistive, capacitive, and/or current source characteristics without the need of any conventional analog-to-digital (A/D) converter and/or the traditional associated signal conditioning circuitry.

2. Description of the Prior Art

Sensor devices are generally categorized in three classes: resistive, capacitive, and current sources. Some typical examples of sensors in these three classes are: resistive sensors—thermistors, gas (i.e., CO, ozone, alcohol, chlorine, butane, benzene, etc.) detectors, and photo detectors; capacitive sensors—Relative Humidity (RH) sensors, liquid level sensors, angular or liner displacement sensors, and presence detectors; and current source sensors—photo diodes, and photo transistors. Presently, in order for a microcontroller to interface with a sensor, an analog-to-digital (A/D) converter or some type of signal conditioning circuitry (i.e., amplifier) is required.

Therefore, a need existed to provide a direct sensor interface module which would allow microcontrollers to directly interface with sensors which have resistive, capacitive, and/or current source characteristics without the need for any conventional A/D converters or the traditional associated signal conditioning circuitry. The direct sensor interface module will be able to provide higher measurement resolution than a conventional implementation using an A/D converter due to the direct sensor interface module's multi-ranging capabilities. The direct sensor interface module will be able to be configured with any one of three input modes: resistance, capacitance, or current source. The direct sensor interface module will further be able to measure multiple sensors of differing types. The direct sensor interface module will also allow the user to choose the reference types and values to perform system calibration during run time, eliminating the need to calibrate each device, and making the direct sensor interface module parameters relatively insensitive to semiconductor process variations.

SUMMARY OF THE INVENTION

In accordance with one embodiment of the present invention, it is an object of the present invention to provide a direct sensor interface module which would allow a microcontroller to directly interface with sensors which have resistive, capacitive, and/or current source characteristics without the need for any conventional A/D converter and/or the traditional associated signal conditioning circuitry.

It is another object of the present invention to provide a direct sensor interface module which will be able to provide higher measurement resolution than a conventional implementation using an A/D converter due to the direct sensor interface module's multi-ranging capabilities.

It is another object of the present invention to provide a direct sensor interface module which is able to be configured to any one of three input modes: resistance, capacitance, and/or current source.

It is still another object of the present invention to provide a direct sensor interface module which is able to measure multiple sensors of differing types.

It is still a further object of the present invention to provide a direct sensor interface module which will allow the user to choose the reference types and values to perform system calibration during run time, eliminating the need to calibrate each device, and making the direct sensor interface module parameters relatively insensitive to semiconductor process variations.

BRIEF DESCRIPTION OF THE PREFERRED EMBODIMENTS

In accordance with one embodiment of the present invention, a direct sensor interface (DSI) module which allows a microcontroller to directly interface to sensors having at least one of a resistive, capacitive, and current source characteristic is disclosed. The DSI module is coupled directly to a sensor device which produces a sensor current proportional to an output reading of the sensor device. A current mirroring circuit is coupled to the sensor device for outputting a charging current proportional to the sensor current of the sensor device. A capacitive device is coupled to the current mirroring circuit. The capacitive device generates a voltage when the capacitive device is charged by the charging current outputted by the current mirroring circuit. A switch is coupled to the capacitive device for allowing the charging current outputted by the current mirroring circuit to charge the capacitive device. The switch is also used for discharging the capacitive device to ground. The DSI module also uses a comparator. The comparator has a first input coupled to a threshold voltage source and a second input coupled to the capacitive device. The comparator is used for signalling when the voltage generated by the capacitive device reaches a level which is equal to the threshold voltage source. A pulse generator having an input coupled to an inverted output of the comparator is used for generating a constant pulse width which causes the switch to close in order to completely discharge the capacitive device to ground when the voltage generated by the capacitive device is equal to the threshold voltage source. The output signal of the pulse generator has a period between constant pulse widths which is equal to the time that the capacitive device is being charged. This time period is proportional to the output reading of the sensor device. The DSI module may further comprise a voltage generator. The voltage generator is coupled to the sensor device and to the current mirroring circuit. The voltage generator is used to set a constant excitation voltage on the sensor device in order for the sensor device to generate the sensor current which is proportional to the output reading of the sensor device.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 7A depicts an application of the Direct Sensor Interface module having resistive inputs only.

FIG. 7B depicts an application of the Direct Sensor Interface module having resistive and capacitive inputs.

FIG. 7C depicts an application of the Direct Sensor Interface module having resistive and current source inputs.

DETAILED DESCRIPTION OF THE PREFERRED EMBODIMENTS

Figure 1:
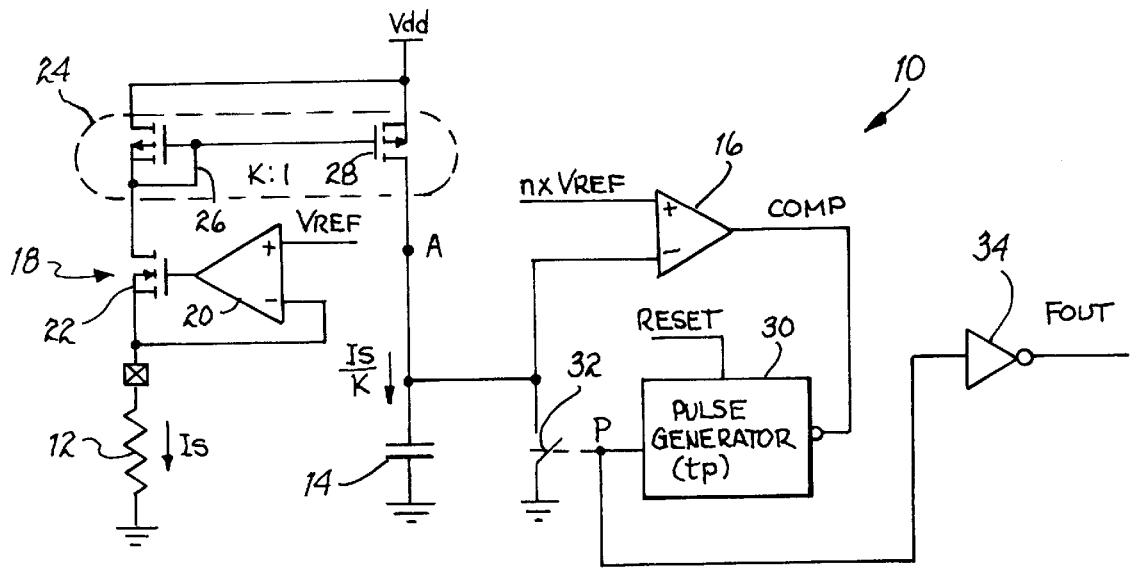
FIG. 1 is a simplified functional block diagram of the Direct Sensor Interface module of the present invention operating in a resistance input mode.

Referring to FIG. 1, a Direct Sensor Interface (DSI) module 10 operating in a resistance input mode is shown. In this embodiment, the DSI module 10 sets a constant excitation voltage on the resistive sensor 12. The sensor current $I_S$ is sampled and used to charge a capacitor 14. Using a voltage comparator 16 and a threshold voltage reference $nV_{REF}$, the time it takes for the voltage of the capacitor 14 to ramp from zero to the threshold voltage reference $nV_{REF}$ can be measured. This charging time is proportional to the resistance of the resistive sensor 12. If the charging time is used to enable a timer, the timer value at the end of each conversion is proportional to the resistance value of the resistive sensor 12.

When the DSI module 10 is operating in a resistance input mode, the excitation voltage is generated by a voltage source 18. The voltage source 18 is comprised of an amplifier 20 and a transistor 22. The voltage source 18 has two input terminals. The first input terminal is coupled to a voltage source $V_{REF}$. The second input terminal is coupled to the resistive sensor 12. The output of the amplifier 20 is coupled to the gate of the transistor 22. The source of the transistor 22 is coupled to the resistive sensor 12 and the drain of the transistor 22 is coupled to a current mirroring circuit 24. In the preferred embodiment of the present invention, the transistor 22 is a Field Effect Transistor (FET).

The amplifier 20 and the transistor 22 form the voltage source 18 which sets the excitation voltage $V_{REF}$ across the resistive sensor 12. This causes a sensor current $I_S$ to flow through the resistive sensor 12 which is equal to the excitation voltage $V_{REF}$ divided by the resistance $R_S$ of the resistive sensor 12 ($I_S=V_{REF}/R_S$). The transistor 22 is used as a voltage follower device. The transistor also enables the user to measure the sensor current $I_S$.

A current mirroring circuit 24 is coupled to the drain terminal of the transistor 22. The current mirroring circuit 24 may take the form of any number of different embodiments wherein the output current of the circuit will be proportional to the input current. For example, the current mirroring circuit may be a cascode circuit. In the embodiment depicted in FIG. 1, the current mirroring circuit 24 is comprised of two main transistors 26 and 28. Transistor 26 is a diode connected transistor having drain, gate, and source terminals. The source terminal of transistor 24 is coupled to a bias voltage source $V_{DD}$. The gate terminal of transistor 26 is coupled to the drain terminal of transistor 26. The drain terminal of transistor 26 is further coupled to the drain terminal of transistor 22. Transistor 28 also has drain, gate, and source terminals. Like transistor 26, the source terminal of transistor 28 is coupled to the bias voltage source $V_{DD}$. The gate terminal of transistor 28 is coupled to the gate terminal of transistor 26. The drain terminal of transistor 28 is coupled to the capacitor 14. In the preferred embodiment of the present invention, transistors 26 an 28 are identical type FETs. The transistors 26 and 28 form a current mirror with a current reduction factor of k to 1, so that the output current of transistor 28 is k times smaller than the sensor current $I_S$ (i.e., output current=$I_S/k$). The value of k is based on the sizing of the transistors 26 and 28.

The output current of transistor 28 is used to charge a the capacitor 14. The voltage $V_C$ of the capacitor 14 ramps up from zero (0) volts at a slop inversely proportional to the resistance $R_S$ of the resistive sensor 12. The capacitor 14 is coupled to one input of a comparator 16. A second input of the comparator 16 is coupled to a threshold voltage $nV_{REF}$ which is used to determine the end of the conversion. The value of the threshold voltage $nV_{REF}$ is based on the particular application. For example, in one embodiment of the present invention, the user may want the threshold voltage $nV_{REF}$ to be equal to a bandgap reference voltage of 1.2 volts. When the DSI module is operating in a resistance input mode, the value of $V_{REF}$ and $nV_{REF}$ can be easily derived from a simple voltage divider as a function of $V_{DD}$ since the $V_{REF}$ terms cancel out when the equation for resistance $R_s$ of the resistive sensor 12 is derived.

When the voltage $V_C$ of the capacitor 14 reaches the threshold voltage $nV_{REF}$, the output of the comparator 16 will go low. This output signal is sent to an inverted input of a pulse generator 30. The pulse generator 30 produces a pulse having a constant pulse width of $t_p$. The pulse will turn on a switch 32 which fully discharges the capacitor 14 to ground. Once the capacitor 14 is completely discharged, the pulse is discontinued and the switch 32 is turned off. The voltage of the capacitor 14 then begins to ramp up from zero (0) volts, and the whole conversion cycle is repeated.

Figure 2:
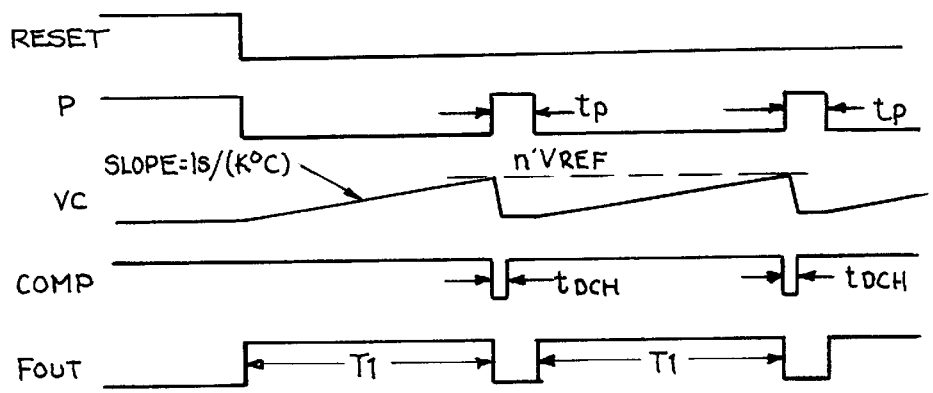
FIG. 2 is a timing diagram of the Direct Sensor Interface module when the Direct Sensor Interface module is operating in a resistance input mode.

As can be seen from the timing diagrams of FIG. 2, during the time that the capacitor 14 is ramping up, the outputs of both the comparator and the inverter 34 are high. When the voltage $V_C$ of the capacitor 14 reaches the threshold voltage $nV_{REF}$, the outputs of both the comparator 16 and the inverter 34 go low. The time when the output of the inverter 34 is high (i.e., the time when the output of the pulse generator 30 is low) is proportional to the value of the resistance $R_s$ of the resistive sensor 12 and the capacitor 14.

The resistance $R_S$ of the resistive sensor 12 may be approximated in the following manner. Since the voltage across the resistive sensor 12 is maintained at $V_{REF}$, the sensor current $I_S$ may be expressed as:

$$I_S = V_{REF}/R_S \qquad (1)$$

where $R_S$ is the resistance the resistive sensor 12.

The voltage across the capacitor 14 can be expressed as:

$$V_C = I_S * t/(k*C) + V_0 \qquad (2)$$

$$V_C = V_{REF} * t/(R_S * k * C) + V_0 \qquad (3)$$

where k is the gain ratio of the transistors 24 and 26 of the current mirroring circuit 24, C is the capacitance of the capacitor 14, and $V_0$ is the equivalent initial value due to voltage comparator offset and the residue charge in the capacitor 14 caused by dielectric absorption.

At a time T1:

$$V_C(T1) = n * V_{REF} \qquad (4)$$

$$V_C(T1) = V_{REF} * T1/(R_S * k * C) + V_0 \qquad (5)$$

$$R_S = V_{REF} * T1/[(n * V_{REF} - V_0) * k * C] \qquad (6)$$

Under near ideal situations, where $V_{REF} >> V_0$ and $n*V_{REF} >> V_0$ (where n is a voltage divider ratio between the amplifier 20 and the comparator 16), the resistance $R_S$ of the resistive sensor 12 can be approximated as:

$$R_S = T1/(n \ast k \ast C) \quad (7)$$

Figure 3:
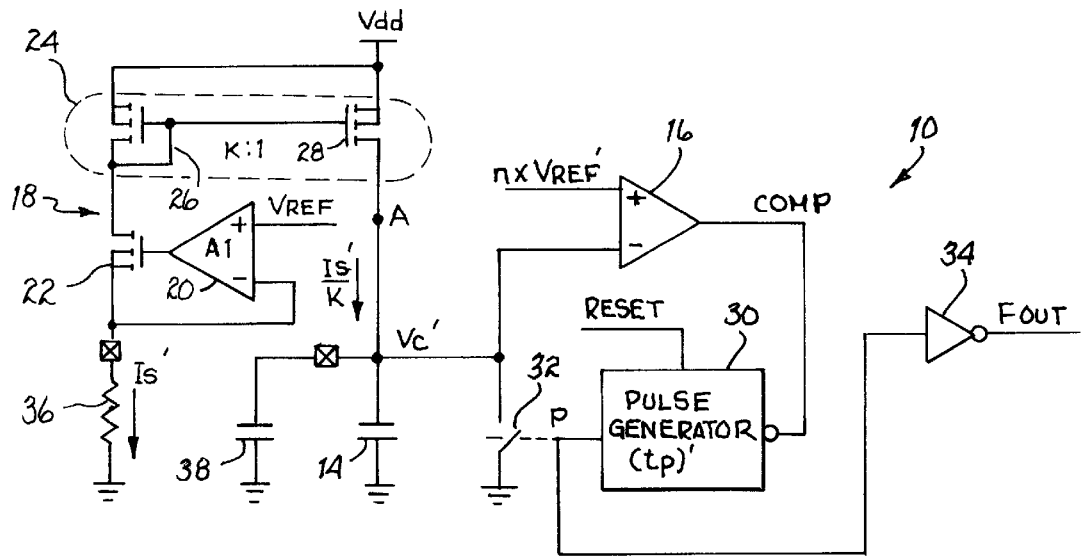
FIG. 3 is a simplified functional block diagram of the Direct Sensor Interface module of the present invention operating in a capacitance input mode.

Referring to FIG. 3 wherein like numerals and symbols represent like elements which operate in the same manner, a second embodiment of the DSI module 10 is shown. In this embodiment, the DSI module 10 is in a capacitive input mode. The operation of the DSI module 10 in the capacitive input mode is very similar to the operation of the DSI module 10 in the resistance mode. In the capacitance mode, the resistive sensor 12 is replaced with a reference resistor 36. The reference resistor 36 is used to set the current mirror 24 to output a constant current $I_S'/k$. When the voltage source 18 sets the excitation voltage $V_{REF}'$ across the reference resistor 36, a constant current $I_S'$ begins to flow through the reference resistor 36 which is equal to the excitation voltage $V_{REF}'$ divided by the reference resistor 36 ($I_S' = V_{REF}'/R_{REF}$) where $R_{REF}$ is the value of the reference resistor 36.

In this embodiment a capacitive sensor 38 is connected in parallel with the capacitor 14. The constant current $I_S'/k$ outputted by the current mirror 24 is then used to charge both the capacitor 14 and the capacitive sensor 38 so that the voltage $V_C'$ across the capacitor 14 and the capacitive sensor 38 begins to ramp up from zero (0) volts. While $V_C'$ is ramping up, the outputs of both the comparator 16 and the inverter 34 are high. When $V_C'$ reaches $nV_{REF}'$, the comparator output changes from a high to a low as does the output from the inverter 34. At this time, the pulse generator 30 produces an output pulse $t_P'$ which activates the switch 32 to fully discharge both the capacitor 14 and the capacitive sensor 38. At the end of the pulse $t_P'$, $V_C'$ will begin to ramp up again, and the output of the inverter 34 returns to a high state. This starts the conversion process all over again. The time when the output of the inverter 34 is high (i.e., the time when the output of the pulse generator 30 is low) is proportional to the sum value of the capacitor 14 and the capacitance of the capacitive sensor 38.

As with the resistance input mode, the values of $V_{REF}'$ and $nV_{REF}'$ in the capacitance input mode can also be derived from a simple voltage divider as a function of $V_{DD}$. The capacitance value of the capacitive sensor 38 can also be derived using a similar derivation as in the resistance input mode. The capacitance value $C_{SENSOR}$ of the capacitive sensor 38 may be expressed as:

$$C_{SENSOR} = T1/(n \ast k \ast R_{REF}') + C \quad (8)$$

where k is the gain ratio of the transistors 24 and 26 of the current mirroring circuit 24, C is the capacitance of the capacitor 14, $R_{REF}$ is the value of the reference resistor 36, and n is a voltage divider ratio between the amplifier 20 and the comparator 16.

Figure 4:
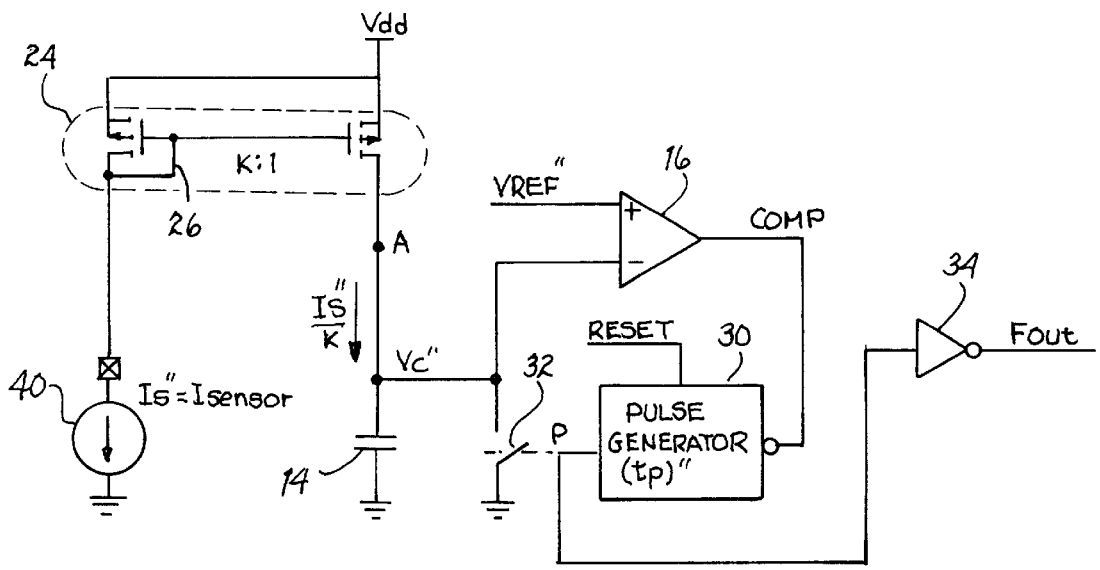
FIG. 4 is a simplified functional block diagram of the Direct Sensor Interface module of the present invention operating in a current source input mode.

Referring to FIG. 4 wherein like numerals and symbols represent like elements which operate in the same manner, a third embodiment of the DSI module 10 is shown. In this embodiment, the DSI module 10 is in a current source input mode. The operation of the DSI module 10 in the current source input mode is very similar to the operation of the DSI module 10 in the resistance and capacitance input modes. In the current source mode, a current source sensor 40 is directly coupled to the drain of the transistor 26 of the current mirroring circuit 24. The current source sensor 40 generates a current $I_S''$ which is sent to the current mirroring circuit 24. The current mirroring circuit 24 generates an output $I_S''/k$ which is used to charge the capacitor 14. The voltage $V_C''$ across the capacitor 14 begins to ramp up from zero (0) volts. While $V_C''$ is ramping up, the outputs of both the comparator 16 and the inverter 34 are high. When $V_C''$ reaches $V_{REF}''$ the comparator output changes from a high to a low as does the output from the inverter 34. At this time, the pulse generator 30 produces an output pulse $t_P''$ which activates the switch 32 to fully discharge both the capacitor 14. At the end of the pulse $t_P''$, $V_C''$ will begin to ramp up again, and the output of the inverter 34 returns to a high state. This starts the conversion process all over again. The time when the output of the inverter 34 is high (i.e., the time when the output of the pulse generator 30 is low) is proportional to the value of the capacitor 14 and the current source sensor 40.

The voltage of the capacitor 14 in the current source input mode may be expressed as:

$$V_C(t) = I_S'' \ast t/(k \ast C) + V_0 \quad (9)$$

where k is the gain ratio of the transistors 24 and 26 of the current mirroring circuit 24, C is the capacitance of the capacitor 14, and $V_0$ is the equivalent initial value due to voltage comparator offset and the residue charge in the capacitor 14 caused by dielectric absorption.

At a time T1:

$$V_C(T1) = V_{REF}'' \quad (10)$$

$$V_C(T1) = I_S'' \ast T1/(k \ast C) + V_0 \quad (11)$$

$$I_S'' = [(V_{REF}'' - V_0) \ast k \ast C]/T1 \quad (12)$$

Under near ideal situations, where $V_{REF}'' \gg V_0$, the sensor current can be approximated as:

$$I_S'' = V_{REF}'' \ast k \ast C/T1 \quad (13)$$

Figure 5:
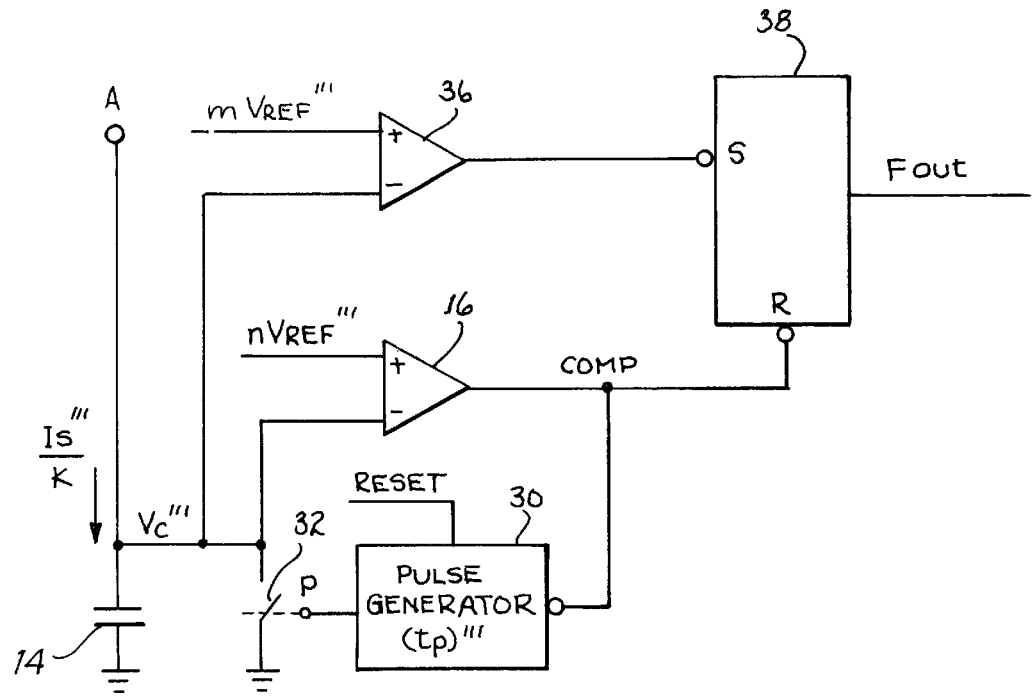
FIG. 5 is a simplified functional block diagram of another embodiment of the Direct Sensor Interface module which is used to increase the accuracy and the consistency of the Direct Sensor Interface module.
Figure 6:
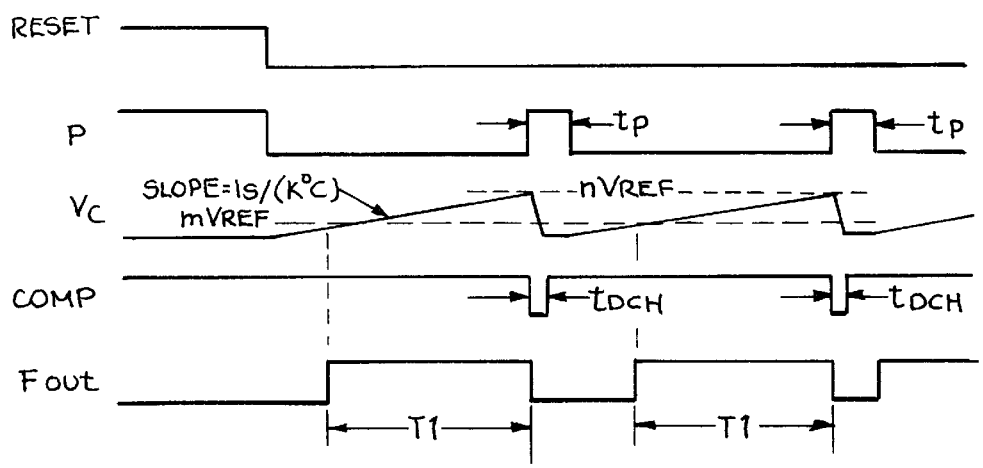
FIG. 6 is a timing diagram of the Direct Sensor Interface module for the embodiment depicted in FIG. 5.

In order to increase the accuracy and the consistency of the DSI module 10, a second comparator may be used to measure the charging time of the capacitor 14 in each of the embodiments discussed above. As can be seen in FIGS. 5 and 6 a second comparator 36 has a first input coupled to a reference voltage source $mV_{REF}'''$ where m is a voltage divider ratio between the amplifier (i.e., amplifier 20 in FIGS. 1, 3, or amplifier 16 in FIG. 4) and the comparator 36. The value of m is a number less than n. The second input of the comparator 36 is coupled to the capacitor 14. As the capacitor 14 is being charged, as soon as the voltage $V_C'''$ reaches the starting voltage of $mV_{REF}'''$ the comparator 36 sets the flip flop 38 and the output of the flip flop 38 goes high. As the capacitor 14 is being charged, the voltage $V_C'''$ will continue to ramp up. When $V_C'''$ reaches $nV_{REF}'''$, the output of comparator 16 resets the flip flop 38 and the output of the flip flop 38 goes low. The comparator 16 also signals the pulse generator 30 to produce an output pulse $t_P'''$ which activates the switch 32 to fully discharge the capacitor 14. At the end of the pulse $t_P'''$, $V_C'''$ will be fully discharged and will begin to ramp up again. This starts the conversion process all over again. The time when the output of the flip flop 38 is high is proportional to the value of the sensor in all three embodiments.

Referring to FIGS. 7A–7C, wherein like numerals and symbols represent like elements, several possible DSI module 10 uses with different types of sensor elements are shown. Referring specifically to FIG. 7A, the DSI module 10 is used to directly interface to a CO sensor and a thermistor (i.e., resistive sensors). The 10K and the 100K reference resistors are used to calibrate the module to cover the sensors' resistance range. It should be noted that the values of the resistors depend on the application and the actual sensor characteristics.

Referring to FIG. 7B, the DSI module 10 is used to directly interface to a relative Humidity (RH) sensor and a thermistor (i.e., resistive and capacitive sensors respectively). The DSI module 10 needs the 10K reference resistor to calibrate the range used to measure the thermistor resistance. To measure the RH sensor, the DSI module 10 uses the 50 pF capacitor as a reference. When the DSI module 10 is measuring a capacitive sensor or reference, the 10K reference resistor is also used to generate the constant current required to operate the DSI module 10. It should be noted that the values of the resistor and the capacitor depend on the application and the actual sensor characteristics.

Referring to FIG. 7C, the DSI module 10 is used to directly interface to a photo diode and a thermistor (i.e., current source sensor and resistive sensor respectively). Again, the 10K and the 100K reference resistors are used to calibrate the DSI module's ranges which cover the sensors' output ranges. It should be noted that the values of the resistors depend on the application and the actual sensor characteristics.

The direct sensor interface module 10 allows a microcontroller to directly interface with sensors which have resistive, capacitive, and/or current source characteristics without the need for any conventional A/D converters or the traditional associated signal conditioning circuitry. The direct sensor interface module 10 will be able to provide higher measurement resolution than a conventional implementation using an A/D converter due to the direct sensor interface multi-ranging capabilities. The direct sensor interface module will be able to be configured with any one of three input modes: resistance, capacitance, or current source. By using a proper multiplexer circuit, the direct sensor interface module will be able to measure multiple sensors of differing types. Using a proper multiplexer circuit also allows the user to choose the reference types and values to perform system calibration during run time, eliminating the need to calibrate each device, and making the direct sensor interface module parameters relatively insensitive to process variations.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A direct sensor interface (DSI) module which allows a microcontroller to directly interface to sensors having at least one of a resistive, capacitive, and current source characteristics comprising, in combination:

a sensor device which generates a sensor current proportional to an output reading of said sensor device;

a current mirroring circuit coupled to said sensor device for outputting a charging current proportional to said sensor current of said sensor device;

a capacitive device coupled to said current mirroring circuit, said capacitive device generating a voltage as said capacitive device is charged by said charging current outputted by said current mirroring circuit;

a switch coupled to said capacitive device for allowing said charging current outputted by said current mirroring circuit to charge said capacitive device and for discharging said capacitive device to ground;

a comparator having a first input coupled to a threshold voltage source and a second input coupled to said capacitive device and said switch for signalling when said voltage generated by said capacitive device reaches a level of said threshold voltage source; and a pulse generator having an input coupled to an inverted output of said comparator for generating a constant pulse width and an output coupled to said switch which causes said switch to close to completely discharge said capacitive device to ground when said voltage generated by said capacitive device reaches said level of said threshold voltage source.

2. A DSI module in accordance with claim 1 wherein said current mirroring circuit is a cascode circuit.

3. A DSI module in accordance with claim 1 wherein said current mirroring circuit comprises:

a first transistor having drain, gate, and source terminals wherein said gate terminal of said first transistor is coupled to said drain terminal of said first transistor, said drain terminal of said first transistor is coupled to said sensor device, and said source terminal of said first transistor is coupled to a bias voltage source; and a second transistor having drain, gate, and source terminals wherein said source terminal of said second transistor is coupled to said bias voltage source and to said source terminal of said first transistor, said gate terminal of said second transistor is coupled to said gate and drain terminals of said first transistor, and said drain terminal of said second transistor is coupled to said capacitive device.

4. A DSI module in accordance with claim 3 wherein said first transistor and said second transistors are Field Effect Transistors (FETs).

5. A DSI module in accordance with claim 1 wherein said sensor device is a current source sensor when said DSI module is operating in a current source input mode.

6. A DSI module in accordance with claim 1 further comprising a voltage generator coupled to said sensor device and to said current mirroring circuit for setting a constant excitation voltage on said sensor device for said sensor device to generate said sensor current proportional to said output reading of said sensor device.

7. A DSI module in accordance with claim 6 wherein said voltage generator comprises:

an amplifier having a first input coupled to a voltage reference source which generates said constant excitation voltage and a second input coupled to said sensor device; and a voltage follower device having a first terminal coupled to an output of said amplifier, a second terminal coupled to said current mirroring circuit, and a third terminal coupled to said sensor device for outputting said constant excitation voltage and for measuring said sensor current.

8. A DSI module in accordance with claim 7 wherein said voltage follower device is a transistor.

9. A DSI module in accordance with claim 8 wherein said transistor is a field effect transistor (FET).

10. A DSI module in accordance with claim 7 wherein said current mirroring circuit comprises:

a first transistor having drain, gate, and source terminals wherein said gate terminal of said first transistor is coupled to said drain terminal of said first transistor, said drain terminal of said first transistor is coupled to said voltage follower device, and said source terminal of said first transistor is coupled to a voltage bias source; and a second transistor having drain, gate, and source terminals wherein said source terminal of said second transistor is coupled to said bias voltage source and to said source terminal of said first transistor, said gate terminal of said second transistor is coupled to said gate and drain terminals of said first transistor, and said drain terminal of said second transistor is coupled to said capacitive device.

11. A DSI module in accordance with claim 10 wherein said sensor device is a resistive sensor element when said DSI module is operating in a resistance input mode, said voltage generator setting a constant excitation voltage on said resistive sensor element for said resistive sensor element to generate said sensor current proportional to said output reading of said sensor device.

12. A DSI module in accordance with claim 11 wherein said sensor device is a reference resistor which generates a constant current source.

13. A DSI module in accordance with claim 12 further comprising a sensor capacitor coupled in parallel with said capacitive device and which is charged by said charging current when said DSI module is operating in a capacitive input mode.

14. A DSI module in accordance with claim 7 further comprising:
- a second comparator having a first input coupled to a voltage source indicating a starting voltage level and a second input coupled to said capacitive device for signalling when said voltage generated by said capacitive device reaches said starting voltage level; and
- a flip flop having an inverted input coupled to said comparator and a second inverted input coupled to said second comparator for generating an output signal when said voltage generated by said capacitive device is greater than said starting voltage level and less than said level of said threshold voltage source, an output signal of said flip flop having a pulse width which is proportional to said output reading of said sensor device.

15. A DSI module in accordance with claim 14 wherein said sensor device is a current source sensor when said DSI module is operating in a current source input mode.

16. A DSI module in accordance with claim 14 wherein said sensor device is a resistive sensor element when said DSI module is operating in a resistance input mode, said voltage generator setting a constant excitation voltage on said resistive sensor element for said resistive sensor element to generate said sensor current proportional to said output reading of said sensor device.

17. A DSI module in accordance with claim 14 wherein said sensor device is a reference resistor which generates a constant current source.

18. A DSI module in accordance with claim 17 further comprising a sensor capacitor coupled in parallel with said capacitive device and which is charged by said charging current when said DSI module is operating in a capacitive input mode.

19. A direct sensor interface (DSI) module which allows a microcontroller to directly interface to sensors having at least one of a resistive, capacitive, and current source characteristics comprising, in combination:
- a sensor device which has a sensor current proportional to an output reading of said sensor device;
- a current mirroring circuit coupled to said sensor device for outputting a charging current proportional to said sensor current of said sensor device;
- a capacitive device coupled to said current mirroring circuit, said capacitive device generating a voltage as said capacitive device is charged by said charging current outputted by said current mirroring circuit;
- a switch coupled to said capacitive device for allowing said charging current outputted by said current mirroring circuit to charge said capacitive device and for discharging said capacitive device to ground;
- a first comparator having a first input coupled to a threshold voltage source and a second input coupled to said capacitive device for signalling when said voltage generated by said capacitive device reaches a level of said threshold voltage source;
- a second comparator having a first input coupled to a voltage source indicating a starting voltage level and a second input coupled to said capacitive device for signalling when said voltage generated by said capacitive device reaches said starting voltage level;
- a flip flop having a first inverted input coupled to said first comparator and a second inverted input coupled to said second comparator for generating an output signal when said voltage generated by said capacitive device is greater than said starting voltage level and less than said level of said threshold voltage source, said output signal of said flip flop having a pulse width which is proportional to said output reading of said sensor device; and
- pulse generator having an input coupled to an inverted output of said first comparator for generating a constant pulse width and an output coupled to said switch which causes said switch to close to completely discharge said capacitive device to ground when said voltage generated by said capacitive device reaches said level of said threshold voltage source.

20. A DSI module in accordance with claim 19 wherein said sensor device is a current source sensor when said DSI module is operating in a current source input mode.

21. A DSI module in accordance with claim 19 further comprising a voltage generator coupled to said sensor device and to said current mirroring circuit for setting a constant excitation voltage on said sensor device for said sensor device to generate said sensor current proportional to said output reading of said sensor device.

22. A DSI module in accordance with claim 21 wherein said voltage generator comprises:
- an amplifier having a first input coupled to a voltage reference source which generates said constant excitation voltage and a second input coupled to said sensor device; and
- an FET having drain, gate and source terminals wherein said gate terminal is coupled to an output of said amplifier, said drain terminal is coupled to said current mirroring circuit, and said source terminal is coupled to said sensor device for outputting said constant excitation voltage and for measuring said sensor current.

23. A DSI module in accordance with claim 22 wherein said sensor device is a resistive sensor element when said DSI module is operating in a resistance input mode, said voltage generator setting a constant excitation voltage on said resistive sensor element for said resistive sensor element to generate said sensor current proportional to said output reading of said sensor device.

24. A DSI module in accordance with claim 22 wherein said sensor device is a reference resistor which generates a constant current source.

25. A DSI module in accordance with claim 24 further comprising a sensor capacitor coupled in parallel with said capacitive device and which is charged by said charging current when said DSI module is operating in a capacitive input mode.

26. A DSI module in accordance with claim 19 wherein said current mirroring circuit comprises a cascode circuit.

27. A DSI module in accordance with claim 19 wherein said current mirroring circuit comprises:

a first field effect transistor (FET) having drain, gate, and source terminals wherein said gate terminal of said first FET is coupled to said drain terminal of said first FET transistor, said drain terminal of said first FET is coupled to said sensor device, and said source terminal of said first FET is coupled to a voltage bias source; and a second FET having drain, gate, and source terminals wherein said source terminal of said second FET is coupled to said bias voltage source and to said source terminal of said first FET, said gate terminal of said second FET is coupled to said gate and drain terminals of said first FET, and said drain terminal of said second FET is coupled to said capacitive device.

* * * * *